March 26, 1968 A. J. MAYHEW 3,375,323
MULTI-LAYER PRINTED CIRCUIT TERMINAL ARRANGEMENT AND METHOD OF MAKING SAME
Filed March 30, 1966
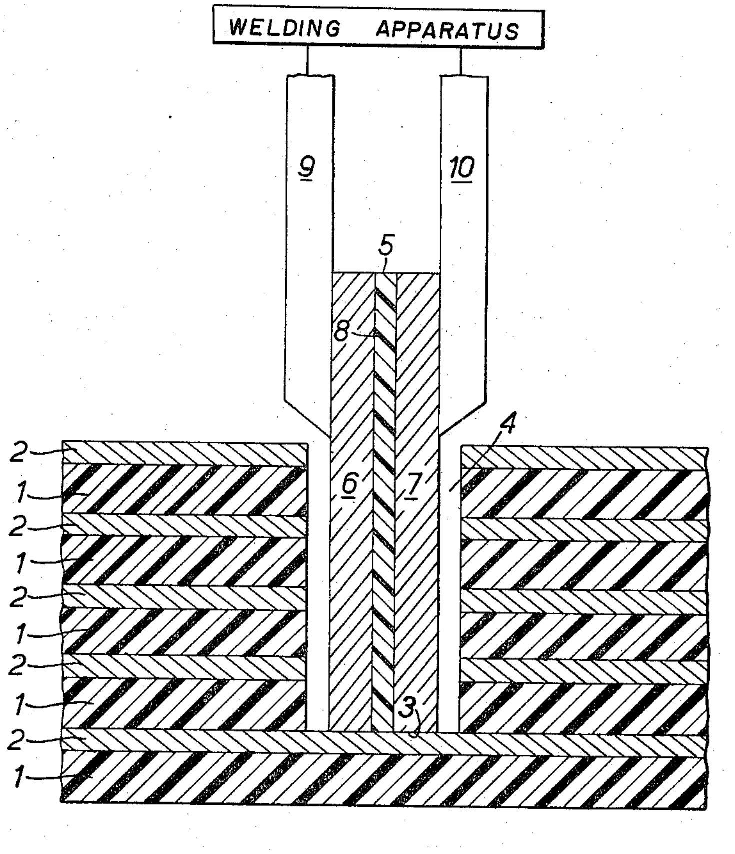
INVENTOR
Antony James Mayhew
BY
Baldwin & Wight
ATTORNEYS United States Patent Office 3,375,323

Patented Mar. 26, 1968

3,375,323

MULTI-LAYER PRINTED CIRCUIT TERMINAL ARRANGEMENT AND METHOD OF MAKING SAME

Antony James Mayhew, Billericay, England, assignor to The Marconi Company Limited, London, England, a British company Filed Mar. 30, 1966, Ser. No. 538,696
Claims priority, application Great Britain, Apr. 5, 1965, 14,359/65
7 Claims. (Cl. 174—68.5)

ABSTRACT OF THE DISCLOSURE

This invention is directed to a multi-layer printed circuit and terminal arrangement in which a multi-layer circuit board is formed from a plurality of conductive circuit layers and insulated layers in sandwiched relationship. A clearance hole extends from one side of the arrangement and terminates internally thereof at one of the conductive layers. A plurality of conductors spaced by an insulating member are disposed within the clearance hole, and terminal ends of the conductors in contact with the conductive layer are secured thereto.

In multi-layer printed circuit arrangements as at present known the need to make connection to the conductive patterns of lower layers leads to serious practical difficulties and limitation of the number of layers which may be stacked one upon another.

In one arrangement at present known a hole is made through the layers above the point at which connection is required to be made to the conductive pattern of a lower layer and one end of a conductor is soldered to the point. The use of a soldered joint militates against the provision of many layers in the stack since unless the hole is made undesirably wide it is impossible to make reliable soldered joints below a certain depth. In practice this known arrangement is limited to the provision of about four layers.

Another arrangement at present known consists again of a hole through the layers above the point at which connection is required to be made to the conductive pattern of a lower layer but the inside surface of the hole is plated with a conductive material to form the required connection. This known arrangement is also limited in the number of layers which may be provided in the stack due to various plating problems and furthermore the arrangement, if it is to be reliable, is expensive to manufacture.

The present invention seeks to provide improved simple and reliable multi-layer printed circuit arrangements in which the number of layers which may be provided is not so limited as with the known arrangements above described.

According to this invention connection is made to the conductive pattern of a lower layer of a multi-layer printed circuit arrangement by means of two conductors spaced apart by insulation and welded at one end to said conductive portions, said conductors with their interposed insulation forming a structure which passes through a clearance hole in the layers above said pattern.

According to a feature of this invention a method of manufacturing a multi-layer printed circuit arrangement in which connection is made to the conductive pattern of a lower layer thereof includes the steps of forming a hole extending through said arrangement to said conductive pattern, preparing two conductors separated by an insulating layer, said conductors and layer being of such dimensions as to be able to extend through said hole to said conductive pattern without touching the wall of said hole, and employing said conductors as welding current conductors while electrically welding them at one end to said conductive pattern.

It will be seen that, although when the making of connection is completed the two conductors form electrically one conductor, the two conductors are insulated from one another up to the time the weld is made. Accordingly the weld can be satisfactorily made at the bottom of a quite deep hole.

Preferably the two conductors are strip conductors with a layer of insulating material sandwiched between them whereby jaws carrying welding current may readily grip the same.

Preferably again the two conductors are beryllium-copper or copper-nickel and the insulating material is polyester resin-bonded glassfibre.

The invention is illustrated in and further described with reference to the accompanying drawing which is a cross-sectional view of one example of multi-layer printed circuit and terminal arrangement in accordance with the present invention. Referring to the drawing a multi-circuit board is shown which includes a plurality of printed circuit layers, each consisting of an insulating layer of stacked substrate 1 and a conductive circuit layer or pattern 2 deposited thereon. For example the stack may be formed by successive depositions of insulating material to form the substrate 1 and conductive material through suitable masks to form the conductive patterns 2. Another well known method of construction comprises forming each layer consisting of a substrate 1 and conductive pattern layer 2 separately and sticking the layers together to form the stack. In the example being described it is required to make connection at a point 3 to the conductive pattern of the lowermost printed circuit layer. To this end a clearance hole 4 is provided through all the layers above the point 3. This hole may either be formed as each layer above the lowermost layer is formed or the hole may be punched or drilled in the required position and to the required depth in the complete stack. A connector 5 consisting of two separate strip conductors 6 and 7 of beryllium-copper, copper-nickel or other suitable material, insulated from one another by an intervening insulating layer or member 8 of polyester resin-bonded glassfibre or other suitable material, is inserted in the hole 4 and welded to the conductive pattern 2 of the lowermost layer at the point 3. Welding of the connector 5 to the conductive pattern 2 at point 3 is effected by gripping the two conductors 6 and 7 between the two jaws, diagrammatically represented at 9 and 10, of the welding head of conventional welding apparatus. By virtue of the electrically isolated nature of the two portions 6 and 7 these two portions act as welding electrodes and the welded joint at 3 is readily and easily made by pressing the conductor 5 against the conductive pattern at point 3 and operating the welding plant. When the weld has cooled and the jaws 9 and 10 released the terminal 5 is left firmly welded in position.

I claim:

1. A printed circuit and terminal arrangement comprising a multi-layer circuit board composed of a plurality of conductive circuit layers and insulating layers in sandwiched relationship, a clearance hole extending from one side of said arrangement and terminating internally of said arrangement at one of said conductive circuit layers, a plurality of conductors disposed within said clearance hole, said conductors being spaced by an insulating member, said conductors have terminal ends in contact with said last-mentioned conductive circuit layer, and means for securing said terminal ends to said last-mentioned conductive circuit layer.

2. The printed circuit and terminal arrangement as defined in claim 1 wherein said plurality of conductors are a pair of strip conductors with a layer of insulating material sandwiched therebetween whereby current passing through welding jaws contacting said conductors secure the terminal ends to said last-mentioned conductive circuit layer by a weld.

3. The printed circuit and terminal arrangement as defined in claim 1, wherein said plurality of conductors are beryllium-copper.

4. The printed circuit and terminal arrangement as defined in claim 1 wherein said plurality of conductors are copper-nickel.

5. The printed circuit and terminal arrangement as defined in claim 1 wherein the insulating member is polyester resin-bonded glass fibers.

6. A method of manufacturing a multi-layer printed circuit and terminal arrangement comprising the steps of stacking a plurality of conductive circuit layers and insulating layers in sandwiched relationship with one of the conductive circuit layers being exposed through a clearance hole extending through one side of the arrangement, maintaining a plurality of conductors insulated from one another, placing the plurality of conductors in the clearance hole with terminal ends thereof in contact with the last-mentioned conductive circuit layer, and welding the plurality of conductors to the last-mentioned conductive circuit layer by passing current through the plurality of conductors.

7. The method as defined in claim 6 wherein the plurality of conductors are maintained insulated from direct contact with each other by an insulating member sandwiched therebetween, and the welding current is passed through the plurality of conductors by contacting two of the conductors with welding jaws of a welding apparatus.

No references cited.

DARRELL L. CLAY, *Primary Examiner.*